United States Patent [19]

Lukco et al.

[11] Patent Number: 5,270,112
[45] Date of Patent: Dec. 14, 1993

[54] HYBRID REINFORCEMENTS FOR HIGH TEMPERATURE COMPOSITES AND COMPOSITES MADE THEREFROM

[75] Inventors: D. Lukco, Sagamore Hills; M. A. Tenhover, Solon, both of Ohio

[73] Assignee: Standard Oil Company, Cleveland, Ohio

[21] Appl. No.: 453,539

[22] Filed: Dec. 20, 1989

[51] Int. Cl.$^5$ ............................................. B32B 9/00
[52] U.S. Cl. ....................................... 428/368; 438/379; 438/384; 438/380; 438/389; 438/689; 438/367; 501/95
[58] Field of Search ............... 428/367, 368, 379, 380, 428/381, 384, 387, 389, 689; 427/419.2, 419.7; 501/95

[56] References Cited

U.S. PATENT DOCUMENTS

| | | | |
|---|---|---|---|
| 3,811,920 | 5/1974 | Galasso et al. | 428/368 X |
| 4,284,687 | 8/1981 | Dreyer et al. | 428/336 |
| 4,315,968 | 2/1982 | Suplinskas et al. | 428/367 |
| 4,340,636 | 7/1982 | DeBolt et al. | 428/215 |
| 4,511,663 | 4/1985 | Taylor | 501/4 |
| 4,642,271 | 2/1987 | Rice | 428/698 |
| 4,806,428 | 2/1989 | Cooper et al. | 428/403 |
| 4,888,311 | 12/1989 | Davidovits et al. | 501/95 |
| 4,950,558 | 8/1990 | Sarin | 428/698 |
| 4,988,564 | 1/1991 | D'Angelo et al. | 428/368 |

Primary Examiner—Donald P. Walsh
Assistant Examiner—Ngoclan Mai
Attorney, Agent, or Firm—Larry W. Evans; Joseph G. Curatolo

[57] ABSTRACT

The subject invention relates to a hybrid reinforcement material comprising a refractory metal core having a first coating comprising aluminum, oxygen and nitrogen, this coating of the general formula:

$$Al_xO_yN_z$$

wherein
x is up to about 670 atomic % of the coating
y is from about 20 atomic % to about 55 atomic % of the coating; and
z is from about 5 atomic % to about 45 atomic % of the coating, with the proviso that $x+y+z=100$, and having a second SiC coating.

The subject invention further relates to a high strength, high temperature performance composite containing the hybrid reinforcement specified above.

27 Claims, 3 Drawing Sheets

HYBRID REINFORCEMENTS FOR HIGH TEMPERATURE COMPOSITES AND COMPOSITES MADE THEREFROM

FIELD OF THE INVENTION

The subject invention relates to reinforcements for high temperature composites that are chemically stable and mechanically stable. In particular, the invention relates to hybrid reinforcement materials consisting of a refractory metal core, an Al—O—N coating on this core, and a thick layer of a high strength SiC material. This combination leads to a reinforcement material which contributes to the high temperature performance of the resulting composite material.

BACKGROUND OF THE INVENTION

Traditionally, many commercial applications of high temperature materials have been filled by Ni-,Co-, and Fe-based metal alloys. These materials function well at temperatures below about 800° C., but rapidly lose strength upon exposure to higher temperatures. Thus, in the field of high temperature materials, researchers have focused on the use of heat resistant fibers to reinforce both metallic and ceramic materials. These high strength composites possess a unique combination of high strength, temperature stability, and low density. This allows for their use in materials for aerospace, automotive, and industrial applications.

Silicon-containing materials are known reinforcements for composite materials. These composites potentially possess high toughness levels and good performance characteristics, thereby making them highly suitable for applications which require light-weight structural materials having high elasticity, high strength, shapability, heat stability, electrical conductivity and heat conductivity. These composites are being increasingly investigated for structural applications.

It is known that many fiber-matrix combinations undergo extensive chemical reaction or interdiffusion between the fiber and matrix materials, each of which is likely chosen for the contribution of specific mechanical and/or physical properties to the resulting composite. Such reaction or interdiffusion can lead to serious degradation in strength, toughness, ductility, temperature stability and oxidation resistance. Some changes may result from the difference in the thermal expansion coefficients of the materials. SiC reinforcements are commonly fabricated by depositing SiC onto a refractory metal core material such as W, Ti, Mo, Ni, Fe, Ti, or NbTi. This core provides a template for SiC deposition and contributes to the high strength of the resulting reinforcement. In addition to the fiber-matrix chemical reactions described above, another potential source of degradation in strength of the reinforcement is the potential chemical reaction between the refractory core material and SiC. Typically, this chemical reaction occurs at 700°-800° C. and leads to the formation of brittle metal-carbide and metal-silicide compounds.

To compensate for these problems, a variety of coatings have been suggested for reinforcements intended for use in fiber-matrix composites. For example, U.S. Pat. No. 4,340,636 discloses a surface treatment for the formation of a carbon-rich coating on a stoichiometric SiC substrate filament. Similarly, U.S. Pat. No. 4,315,968 discloses coating SiC filaments with a coating of Si-rich SiC. U.S. Pat. No. 3,811,920 discusses applying a thin layer of TiC to a filamentary substrate having a SiC surface layer. Boron nitride has also been used as a SiC coating, as in U.S. Pat. No. 4,642,271.

Intermetallic matrix materials have experienced problems similar to those enumerated hereinabove when combined with reinforcements to produce high performance composites. The problems being experienced in this technology field are generally a result of the fact that the matrix material technology and fiber technology have evolved independent of one another, resulting in chemical and mechanical incompatibility of the precursor materials used to produce composites of the type disclosed hereinabove. The foregoing citations demonstrate various attempts within the field to overcome the inherent shortcomings of these composites by using coating materials to provide the needed characteristics or compatibility.

However, composite materials which have employed techniques and coatings such as the foregoing nonetheless remain limited for high temperature application by the chemical instability of the refractory core material in contact with sic.

Accordingly, an object of the subject invention is to provide a coating for a refractory metal core material which permits the use of SiC reinforcements in composite materials for use at high temperatures.

Another object of this invention is to provide a coating for a refractory metal core that prevents chemical reaction between the refractory metal core and SiC.

A further object is to provide a composite which contains SiC reinforcements which maintains high strength and toughness at high temperatures.

SUMMARY OF THE INVENTION

The subject invention relates to a hybrid reinforcement material comprising a refractory metal core having a first coating comprising aluminum, oxygen and nitrogen, this coating of the general formula:

$Al_xO_yN_z$ wherein
  x is up to about 60 atomic % of the coating;
  y is from about 20 atomic % to about 55 atomic % of the coating; and
  z is from about 5 atomic % to about 45 atomic % of the coating, with the proviso that x+y+z=100, and
having a second SiC coating.

The subject invention further relates to a high strength, high temperature performance composite containing the hybrid reinforcement specified above.

DETAILED DESCRIPTION OF THE INVENTION

Figure 1:
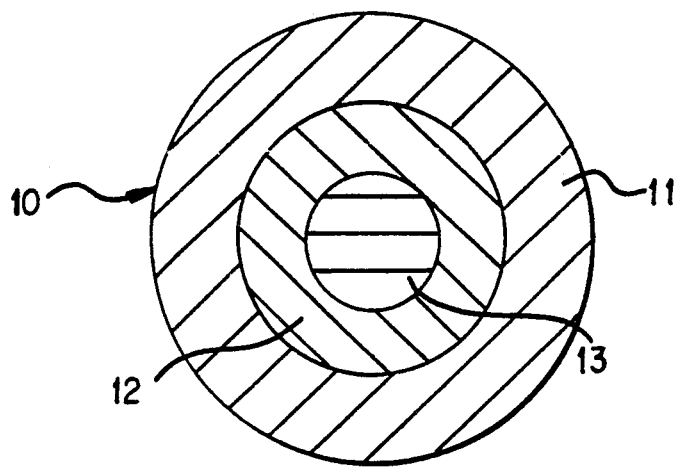
FIG. 1 represents a cross-section of a hybrid reinforcement comprising a refractory metal core having a first coating of Al, O and N and a second coating of SiC.

The subject invention relates to a hybrid reinforcement material comprising a refractory metal core coated with an Al—O—N material layer having the general formula:

$$Al_xO_yN_z$$

wherein x is present at up to about 60 atomic % of the coating; y is from about 20 atomic % to about 55 atomic % of the coating; and z is from about 5 atomic % to about 45 atomic % of the coating, with the proviso that x+y+z=100, which is further coated with a thick SiC layer.

The refractory metal core can take the form of a wire, ribbon, or filament and can consist of W, Mo, Nb, NbTi, Ti, Ni, Fe, and alloys containing these elements. Such core materials are commercially available from Alpha Inorganics and Johnson-Mathey, among others. This metal core, once coated as disclosed herein, is then used as a template to fabricate a high strength SiC reinforcement.

The Al—O—N material layer deposited on the refractory metal core is of importance due to its compatibility with not only the refractory metal core to be coated, but also the SiC layer which is subsequently deposited thereon. The Al—O—N material layer effectively inhibits the diffusion of Si and C, has excellent oxidation resistance, and forms smooth, adherent coatings on the refractory metal core. Because of these characteristics, the resulting reinforcement is capable of maintaining its strength and high temperature performance, even in the presence of air at temperatures exceeding 8000° C. for extended periods of time, thus making the composite highly suitable for demanding industrial applications.

Depending on the deposition procedure used in applying the Al—O—N material layer to the refractory metal core, oxygen and nitrogen for the subject layer may be derived from N- and O-containing gases, which may be in the elemental state or may be in the compound form. The Al may be obtained from volatile Al-containing compounds or metallic Al sources. Further, when using a sputter technique, the coating composition may be directly sputtered from an Al—O—N target.

The Al—O—N material layer, as described herein, can be deposited by any conventionally known thick or thin film deposition process, examples of which include but are not limited to chemical vapor deposition, rf sputtering, reactive sputtering, reactive ion plating, and reactive evaporation. The Al—O—N material layer should be deposited in a layer that is from about 0.5 microns to about 10 microns thick, preferably between about 1.0 micron to about 5.0 microns. Optimally, the refractory metal core should be completely coated. Minimal areas that remain uncoated will not, however, adversely affect the reinforcement performance due to the localized nature of the reaction sites which exist in uncoated areas.

Prior to coating the refractory metal core, it may be pretreated to enhance the adherence of the Al—O—N material layer to the refractory metal core and the smoothness of the refractory metal core-Al—O—N interface. Such pretreatment processes may include chemical etching, ion etching, flame polishing and mechanical polishing, among others, which may be accomplished by conventional pretreatment techniques.

The SiC layer may be applied by chemical vapor deposition, physical vapor deposition, such as magnetron sputtering, or thick film techniques such as sol-gel or polymer decomposition, all of which are conventionally know techniques. This SiC layer should range from about 25 microns to about 250 microns in thickness. It may contain trace amounts of other elements, such as oxygen and nitrogen, and metals such as Fe and Ti.

FIG. 1 is a cross-section of a hybrid reinforcement 10, as disclosed hereinabove, having a refractory metal core 13, coated with a layer of an Al—O—N material 12, which is then further coated with a SiC layer 11.

The hybrid reinforcement, comprising a refractory metal core, an Al—O—N material layer and a SiC layer, as described hereinabove, may be fabricated into various shapes or may be woven or otherwise structured prior to combination with the matrix material. This fabrication may be accomplished according to conventional techniques.

Suitable matrix materials into which reinforcements coated according to this disclosure are to be disposed include ceramic, glass and intermetallic matrix composites. Generally, matrix materials include: reaction-bonded SiC; intermetallic alloys containing at least two of Ti, Al, Nb, Ta, Cr, V and Si; glass ceramics containing at least two of Li, Al, Si, O, Ca, Sr and Mg; and metal alloys containing at least two of Al, Si, Mg, Ni and Li. Table I below lists a number of representative matrix materials suitable for use in the subject invention, though this list is not intended to be exhaustive of all possible matrix materials.

TABLE I

| Potential matrix materials | | |
|---|---|---|
| Intermetallics: | | |
| $Ti_3Al$ | $TiAl$ | $TiAl_3$ |
| $Nb_3Al$ | $NbAl$ | $NbAl_3$ |
| $Zr_3Al$ | $ZrAl$ | $ZrAl_3$ |
| $Ta_3Al$ | $TaAl$ | $TaAl_3$ |
| $Ni_3Al$ | $NiAl$ | $Ni_3AlB_{0.01}$ |
| $Fe_3Al$ | $FeAl$ | $Fe_3AlB_{0.01}$ |
| $Ti_5Si_3$ | $Zr_5Si_3$ | $Al_{67}Ni_8Ti_{25}$ |
| $Ti_{44}Nb_{11}Al_{45}$ | $Ti_{65}V_{10}Al_{25}$ | $Ni_2AlTi$ |
| $TiTaAl_{0.8}Cr_{0.1}V_{0.1}$ | $TiNbAl_{0.7}V_{0.1}Si_{0.3}$ | $MoSi_2$ |
| $TiTaAl_2$ | | |
| Glass-Ceramics | | |
| $SiO_2$ | $Al_2O_3$ | $MgO$ |
| $SiO_2.Al_2O_3$ | $CaO.3SiO_2$ | $MgO.SiO_2.2Al_2O_3$ |
| $Li_2O.Al_2O_3.2SiO_2$ | $Li_2O.Al_2O_3.4SiO_2$ | $Li_2O.Al_2O_3.8SiO_2$ |
| $BaO.2SiO_2.2Al_2O_3$ | $CaO.2SiO_2.2Al_2O_3$ | $MgO.CaO.2SiO_2.4Al_2O_3$ |
| $4BaO.8SiO_2.8Al_2O_3.TiO_2$ | | |

For intermetallics, especially interesting are the titanium-aluminide alloys described in a JOM article from July 1989, pages 24-30, by Young-Won Kim entitled, "Intermetallic Alloys based on Gamma Titanium Aluminide", and also the silicide alloys described in JOM November 1989, pages 52-55, by Peter J. Meschter and Daniel S. Schwartz entitled "Silicide-Matrix materials for High Temperature Applications." Preferred matrix materials include intermetallic alloys such as $Ti_3Al$, $TiAl$, $Ti_{44}Nb_{11}Al_{45}$, $TiTaAl_2$, $Ni_3Al$, $FeAl$ and $NbAl_3$. Matrix materials may be obtained commercially in the form of powders or foils, such as TiAl powder or foil, or may be formulated by arc melting, casting, hot pressing or other known techniques.

When preparing hybrid reinforcements by sputtering, the process is preferably carried out by first depositing an Al—O—N material layer on a refractory metal core. This can be accomplished using an Al metal sputter target in the presence of a mixture of nitrogen and oxygen. The ratio of N/O should be greater than about 100/1. optionally, an inert gas, such as Argon, may also be present. The total pressure of the sputter gas should be less than about 50 mtorr. The temperature during the deposition process may be anywhere from room temperature to about 1000° C. The deposition rate may vary from 1 to about 1000 angstroms/second. The resulting Al—O—N layer should be between about 0.5 microns and about 10 microns thick, and have a density of at least about 80% and preferably greater than 95%.

The efficiency of the diffusion barrier properties of the Al—O—N material layer is related to the density of the layer, i.e. density in excess of about 80% corresponds to minimal or no diffusion of elements from the reinforcement to the matrix.

The Al—O—N coated refractory metal core is used as a template for the fabrication of the SiC reinforcement, i.e. the hybrid reinforcement. As was previously stated, the SiC layer may be deposited onto the Al—O—N coated refractory metal core by any known thick film deposition technique. This thick SiC layer provides the strength and modulus for the resulting hybrid reinforcement.

A similar hybrid reinforcement can be prepared by chemical vapor deposition of the Al—O—N layer on a refractory metal core by using Al-halogen compounds, Al-organometallic compounds or metallic Al, in the presence of a combination Of $O_2$ and $N_2$. The temperature range for such a process is between about 400° C. and about 1000° C. Use of an rf or dc plasma to aid in the deposition process may be necessary. Subsequent deposition of the SiC layer is accomplished as stated above.

The hybrid reinforcement may then be combined with a selected matrix material by any of a number of methods and techniques known to those skilled in the art, such as hot pressing or melt infiltration, among others.

The hybrid reinforcement produced according to the process set forth herein may be further coated, prior to combination with a suitable matrix. An example of one such coating for the hybrid reinforcement is disclosed in U.S. Ser. No. 453,536, entitled "Coated Reinforcements For High Temperature Composites and Composites Made Therefrom", to our common assignee, which discloses a coating suitable for use on Si-containing reinforcements.

Hybrid reinforcements, such as those disclosed herein, are operable in an environment wherein the temperature ranges up to 0.9 of the melting point of the matrix material. Further, such composites are operable at pressures from 0 to about 100 atms., and can be used in air, vacuum or inert atmospheres, such as Ar, $N_2$ or He.

EXAMPLES

The following experimentation was conducted to demonstrate the stability of hybrid SiC reinforcements at elevated temperatures. Coatings were applied to metal wires, fibers, and metal templates, and heat treated to ascertain their thermochemical stability. The various coatings were applied to a substrate using magnetron sputtering and a commercial S-gun arrangement. The object to be coated was mounted in a cryopumped (base pressure $2 \times 10^{-7}$ torr) vacuum chamber on a sample holder that rotated about the sputter gun to insure an even coverage of the coating. The foregoing process produced smooth, dense, adherent coatings. The thickness of the coating was determined by a TM-100 thickness monitor in the vacuum chamber.

Following deposition, the samples were tested by exposure to high temperature heat treatments. These were performed in a high vacuum chamber (cryopump $5 \times 10^{-7}$ torr) using a temperature controlled resistance Radak furnace.

X-ray photoelectron spectroscopy (XPS) was used to determine the extent of reaction between the various coatings, matrix materials, and SiC. The XPS spectra were acquired on a PHI 5400 XPS Instrument using 300 watt Mg $K_\alpha$x-rays, and 1 mm diameter spot size. Depth profiling was accomplished by sputtering with an argon ion beam with a current of 25 mA, followed by the acquisition of the XPS spectra. The pressure in the main analysis chamber during this analysis was less than $10^{-10}$ torr.

EXAMPLE 1

A reinforcement material was prepared by magnetron sputtering approximately 500 angstroms of SiC onto a tungsten ribbon template (0.1 mm thick). This reinforcement was heated in vacuum ($10^{-7}$ torr) for 4 hours at a temperature of 1000° C. X-ray photoelectron spectroscopy depth profiling was performed to gauge the stability of the reinforcement. This analysis showed that the SiC layer had been consumed during the heat treatment and that brittle tungsten-carbides and tungsten-silicides had been formed (FIG. 2), thus illustrating the instability of SiC directly deposited on a W template.

Figure 2:
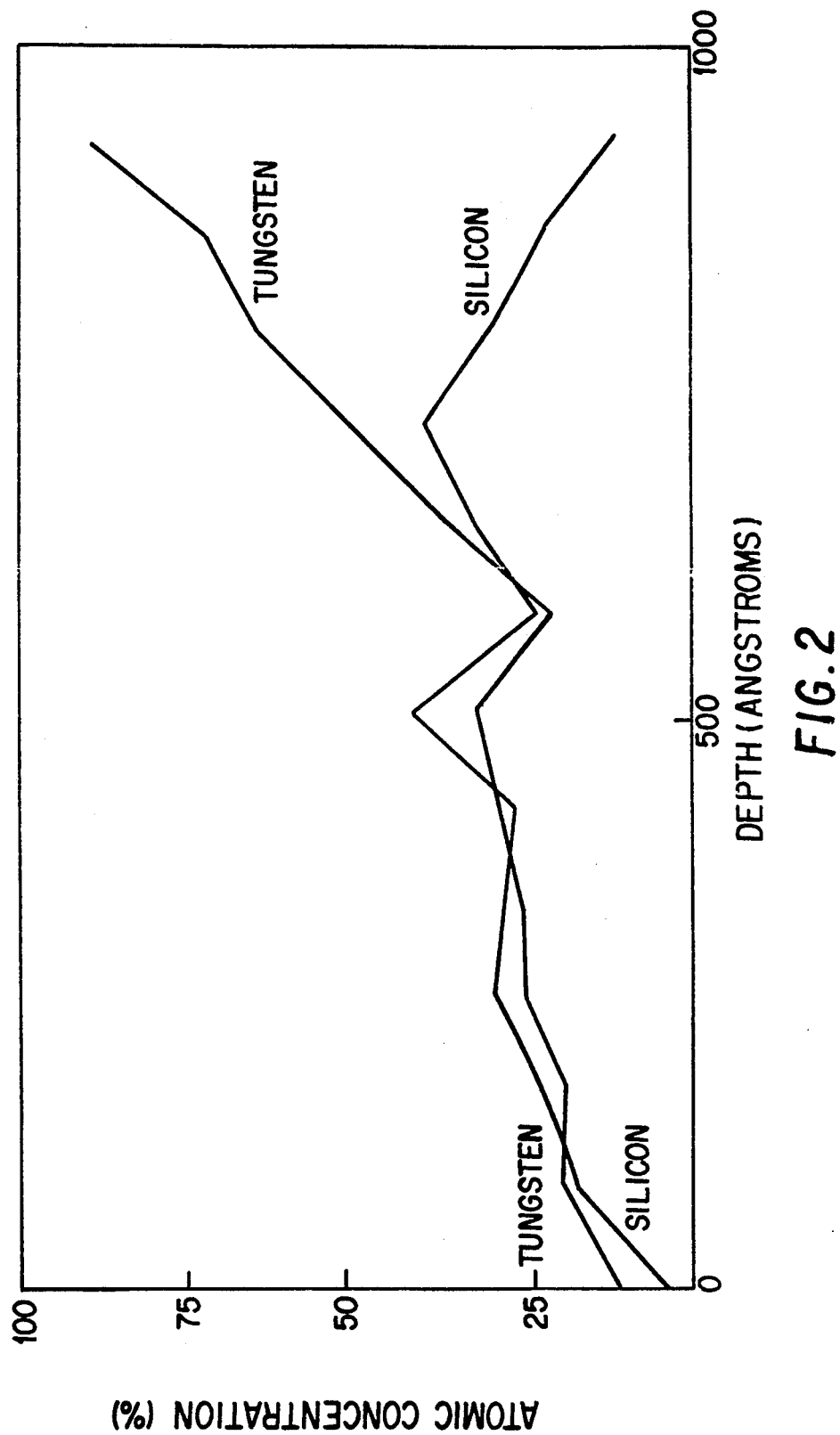
FIG. 2 is an XPS depth profile of a SiC coated W core after 1000° C. heat treatment.

FIG. 2 is an XPS depth profile following heat treatment, measured as described hereinabove, for the sample of Example 1. The profile starts on the surface of the sample (depth=0 angstroms) and continues through the sample until it reaches the tungsten template. Both Si and W were monitored in this experiment. It is observed in FIG. 2 that Si has diffused deep into the W template and that w has likewise diffused to the surface of the structure. The SiC and W have thus undergone extensive reaction, forming brittle tungsten-carbides and tungsten-silicides. The use of SiC directly on a tungsten template was therefore limited to use temperatures less than about 800° C.

EXAMPLE 2

Figure 3:
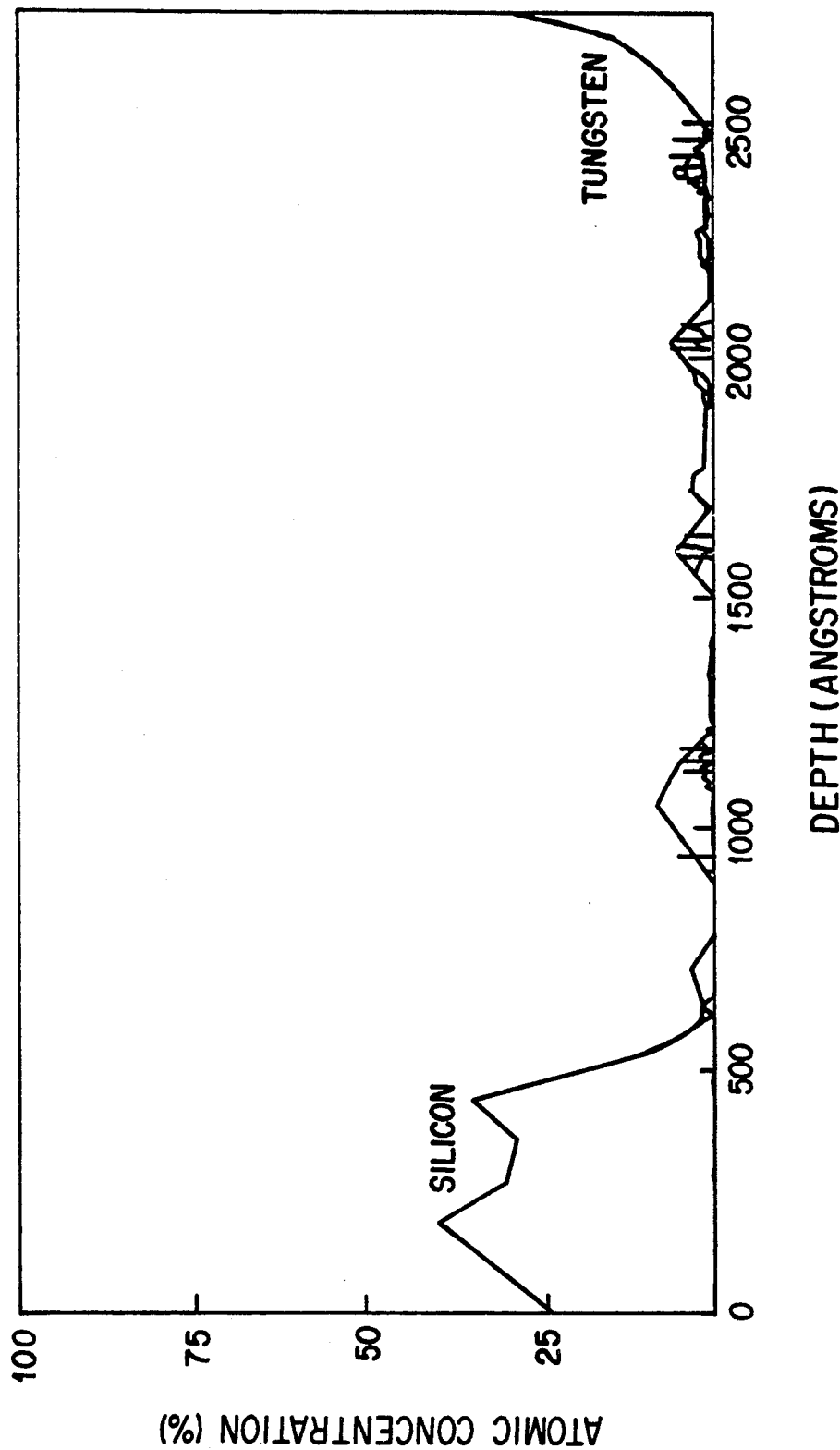
FIG. 3 is an XPS depth profile of a W core which has been coated with first Al—O—N and then SiC after 1000° C. heat treatment.

A reinforcement material was made by first coating a tungsten ribbon template with approximately 1400 angstroms of $Al_{44}O_{18}N_{38}$ followed by magnetron sputtering of 500 angstroms of SiC. This reinforcement was heated in vacuum ($10^{-7}$ torr) for 4 hours at a temperature of 1000° C. X-ray photoelectron spectroscopy depth profiling was performed to gauge the stability of the reinforcement. This analysis showed that the SiC, $Al_{44}O_{18}N_{38}$ and tungsten components were unchanged by the heat treatment (FIG. 3). This example, therefore, illustrates the importance of the Al—O—N layer on the thermal stability of the reinforcement.

FIG. 3 is an XPS depth profile following heat treatment, also measured as described hereinabove, for the sample of Example 2. The profile starts on the surface of the sample (depth=0 angstroms) and continues through the sample until it reaches the tungsten template. Both Si and W were monitored in this experiment. It is observed in FIG. 3 that neither Si or W has diffused in this structure. The Al—O—N coating has effectively eliminated the reaction between SiC and W and therefore, allows the use of such a reinforcement at higher temperatures than that of Example 1.

The foregoing examples have been presented to demonstrate the oxidation and corrosion resistance in air at high temperatures above 800° C. of reinforcements comprising a refractory metal core coated with an Al—O—N-material coating, and further coated with a thick layer of SiC as set forth herein. These examples are not intended to limit the subject invention, the breadth of which is defined by the specification and the claims appended hereto, but are presented rather to aid those skilled in the art in clearly understanding the invention defined herein.

What we claim is:

1. A hybrid reinforcement material comprising a refractory metal core having a first coating comprising aluminum, oxygen and nitrogen, said coating of the general formula:

$$Al_xO_yN_z$$

wherein
 x is up to about 60 atomic % of the coating;
 y is from about 20 atomic % to about 55 atomic % of the coating; and
 z is from about 5 atomic % to about 45 atomic % of the coating, with the proviso that $x+y+z=100$, and having a second SiC coating.

2. The hybrid reinforcement material as in claim 1 wherein said first coating is deposited by a thick film deposition process.

3. The hybrid reinforcement material as in claim 1 wherein said first coating is deposited by a thin film deposition process.

4. The hybrid reinforcement material as in claim 1 wherein said second coating is deposited by a thick film deposition process.

5. The hybrid reinforcement material as in claim 1 wherein said first coating is from about 0.5 microns to about 10 microns thick.

6. The hybrid reinforcement material as in claim 1 wherein said first coating is from about 1.0 microns to about 5.0 microns thick.

7. The hybrid reinforcement material as in claim 1 wherein said second coating is from about 25.0 microns to about 250.0 microns thick.

8. The hybrid reinforcement material as in claim 1 wherein said refractory metal core is selected from the group consisting of W, Mo, Nb, NbTi, Ti, Ni, Fe and alloys thereof.

9. The hybrid reinforcement material as in claim 1 wherein said refractory metal core is a wire.

10. The hybrid reinforcement material as in claim 1 wherein said refractory metal core is a ribbon.

11. The hybrid reinforcement material as in claim 1 wherein said refractory metal core is a filament.

12. The hybrid reinforcement material as in claim 1 wherein said refractory metal core is pretreated prior to the addition of said first coating to said refractory metal core.

13. The hybrid reinforcement material as in claim 1 wherein said hybrid reinforcement material is fabricated into a shape.

14. A high strength, high temperature performance composite comprising a hybrid reinforcement material comprising a refractory metal core having a first coating comprising aluminum, oxygen and nitrogen, and a second SiC coating, said hybrid reinforcement material in combination with a matrix material.

15. The composite as in claim 14 wherein said matrix material is selected from the group consisting of ceramic, glass and intermetallic.

16. The composite as in claim 14 wherein said matrix material is selected from the group consisting of reaction-bonded SiC, intermetallic alloys, glass ceramics and metal alloys.

17. The composite as in claim 14 wherein said matrix material is selected from the group consisting of $Ti_3Al$, $TiAl$, $Ti_{44}Nb_{11}Al_{45}$, $TiTaAl_2$, $Ni_3Al$, $FeAl$ and $NbAl_3$.

18. The composite as in claim 14 wherein said first coating is of the general formula:

$$Al_xO_yN_z$$

wherein
 x is up to about 60 atomic % of said coating;
 y is from about 20 atomic % to about 55 atomic % of said coating; and
 z is from about 5 atomic % to about 45 atomic % of said coating; with a proviso that $x+y+z=100$.

19. The composite as in claim 18 wherein said first coating has a density of greater than 80%.

20. The composite as in claim 18 wherein said first coating has a density of greater than 95%.

21. The composite as in claim 14 wherein said first coating is deposited by a thick film deposition process.

22. The composite as in claim 14 wherein said first coating is deposited by a thin film deposition process.

23. The composite as in claim 14 wherein said second coating is deposited by a thin film deposition process.

24. The composite as in claim 14 wherein said first coating is from about 0.5 microns to about 10 microns thick.

25. The composite as in claim 14 wherein said first coating is from about 1.0 microns to about 5.0 microns thick.

26. The composite as in claim 14 wherein said second coating is from about 25.0 microns to about 250.0 microns thick.

27. The composite as in claim 14 wherein said refractory metal core is pretreated prior to the deposition of said first coating.

* * * * *